(12) United States Patent
Shen et al.

(10) Patent No.: US 11,008,424 B2
(45) Date of Patent: *May 18, 2021

(54) THERMAL INTERFACE MATERIAL ASSEMBLIES AND SYSTEMS AND METHODS FOR CONTROLLABLY CHANGING SURFACE TACK OF THERMAL INTERFACE MATERIALS

(71) Applicant: Laird Technologies, Inc., Chesterfield, MO (US)

(72) Inventors: Jingbo Shen, Tianjin (CN); Mandy Feng, Tianjin (CN); Jingqi Zhao, Tianjin (CN)

(*) Notice: Subject to any disclaimer, the term of this patent is extended or adjusted under 35 U.S.C. 154(b) by 34 days.

This patent is subject to a terminal disclaimer.

(21) Appl. No.: 16/531,552

(22) Filed: Aug. 5, 2019

(65) Prior Publication Data

US 2019/0352467 A1 Nov. 21, 2019

Related U.S. Application Data

(63) Continuation of application No. 15/670,249, filed on Aug. 7, 2017, now Pat. No. 10,370,500.

(30) Foreign Application Priority Data

Aug. 9, 2016 (CN) .......................... 201610647223.6
Aug. 9, 2016 (CN) .......................... 201620854499.7

(51) Int. Cl.
*C08G 77/62* (2006.01)
*C09D 183/04* (2006.01)
(Continued)

(52) U.S. Cl.
CPC .............. *C08G 77/62* (2013.01); *C08L 67/03* (2013.01); *C09D 143/04* (2013.01);
(Continued)

(58) Field of Classification Search
CPC .... B32B 2398/00; C08G 77/20; C08G 77/62; C08L 67/03; C09D 143/04; C09D 183/04;
(Continued)

(56) References Cited

U.S. PATENT DOCUMENTS 6,037,659 A * 3/2000 Weixel ................. H01L 23/433
257/706
2013/0265721 A1 10/2013 Strader et al.
2018/0044480 A1 2/2018 Shen et al.

FOREIGN PATENT DOCUMENTS

WO  WO-2010104534 A1  9/2010

OTHER PUBLICATIONS

European Search Report for EP application No. 17184992 which claims priority to the same parent application as the instant application, dated Dec. 6, 2017, 6 pages.

* cited by examiner

*Primary Examiner* — Michael B Nelson
(74) *Attorney, Agent, or Firm* — Harness, Dickey & Pierce, P.L.C.; Anthony G. Fussner (57) ABSTRACT

Disclosed are exemplary embodiments of systems and methods for controllably changing (e.g., weaken, strengthen, eliminate, add, customize, alter, etc.) surface tack of thermal interface materials. Also disclosed are exemplary embodiments of thermal interface material assemblies, which include coatings configured to change surface tack of the thermal interface materials.

20 Claims, 3 Drawing Sheets

(51) Int. Cl.
*C08L 67/03* (2006.01)
*C09D 143/04* (2006.01)
*C08G 77/20* (2006.01)

(52) U.S. Cl.
CPC ........ *C09D 183/04* (2013.01); *B32B 2398/00* (2013.01); *C08G 77/20* (2013.01)

(58) Field of Classification Search
CPC .. H01L 23/3735; H01L 23/3737; H01L 23/42
See application file for complete search history.

FIG. 1

FIG. 3 ered on May 24, 2017 as Chinese Utility Model Patent No. ZL 201620854499.7.

THERMAL INTERFACE MATERIAL ASSEMBLIES AND SYSTEMS AND METHODS FOR CONTROLLABLY CHANGING SURFACE TACK OF THERMAL INTERFACE MATERIALS

CROSS-REFERENCE TO RELATED APPLICATIONS

This application is a continuation of U.S. Patent Application Ser. No. 15/670,249 filed Aug. 7, 2017, which published as US 2018/0044480 on Feb. 15, 2018 and issues as U.S. Pat. No. 10,370,500 on Aug. 6, 2019.

U.S. patent application Ser. No. 15/670,249 claims the benefit of and priority to Chinese Invention Patent Application No. 201610647223.6, filed Aug. 9, 2016 and Chinese Utility Model Application No. 201620854499.7 filed Aug. 9, 2016, which granted on May 24, 2017 as Chinese Utility Model Patent No. ZL 201620854499.7.

The entire disclosures of the above applications are incorporated herein by reference.

FIELD

The present disclosure relates to systems and methods for controllably changing (e.g., weaken, strengthen, eliminate, add, customize, alter, etc.) surface tack of thermal interface materials. The present disclosure also relates to thermal interface material assemblies, which include coatings configured to change surface tack of the thermal interface materials.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material. The thermal interface material may be used to fill the gap between thermal transfer surfaces, in order to increase thermal transfer efficiency as compared to having the gap filled with air, which is a relatively poor thermal conductor.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

When formulating a thermal interface material (e.g., thermally-conductive gap filler sheet materials, etc.), there is a tradeoff between material application performance and material functional performance through formulation adjustment. For example, it is sometimes necessary to sacrifice thermal performance (e.g., reduce thermal conductivity, etc.) of a thermally-conductive gap filler sheet material through formulation adjustment in order to improve handleability and/or achieve better application performance (e.g., make it easier to handle, apply, assembly, rework, transport, etc.). After recognizing the above, the inventors hereof have developed and disclose herein systems and methods for controllably changing (e.g., weaken, strengthen, eliminate, add, customize, alter, etc.) surface tack of a thermal interface material. Also disclosed are exemplary embodiments of thermal interface materials and thermal interface material assemblies, which include coatings configured to change surface tack of the thermal interface materials.

Figure 1:
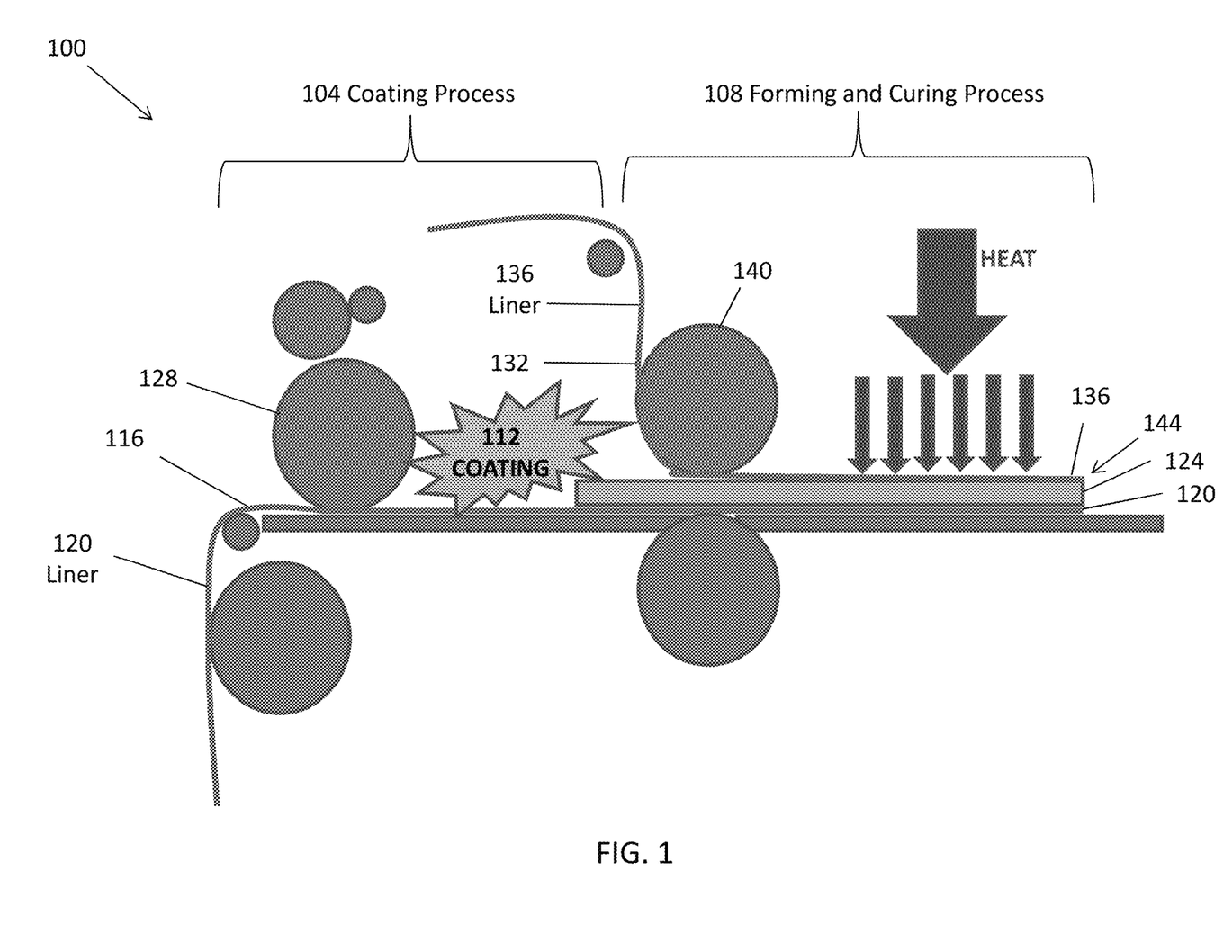
FIG. 1 is an illustration representing an exemplary system according to an exemplary embodiment that include a coating process for controllably changing surface tack of a thermal interface material and/or strengthening the surface mechanical performance to improve material application performance of the thermal interface material.

With reference to the figures, FIG. 1 represents an exemplary system 100 according to an exemplary embodiment embodying one or more aspects of the present disclosure. As shown in FIG. 1, the system 100 includes a coating process 104 prior to a forming and curing process 108.

During the coating process 104, a coating 112 (e.g., silicone or silicone compound mixture, etc.) is wet coated onto (broadly, applied to) an inner or upper surface 116 of a first or lower liner 120 (e.g., a polyethylene terephthalate (PET) carrier and/or release liner, an embossed polyethylene liner, etc.) along which a thermal interface material (TIM) 124 (e.g., thermally-conductive gap filler sheet material, etc.) will be disposed. The coating 112 is disposed between the inner surface 116 of the first liner 120 and the lower surface of the TIM 124.

As disclosed herein, the coating 112 is formulated or configured to controllably change (e.g., weaken, strengthen, eliminate, add, customize, alter, etc.) surface tack of the TIM 124 and/or strengthen the surface mechanical performance to improve material application performance of the TIM 124. The coating 112 may comprise a silicone or silicone compound mixture including one or more other chemicals or other functional fillers to provide material special functional performance.

The coating 112 may be wet coated onto (broadly, applied to) the inner surface 116 of the first liner 120. For example, rollers 128 may be used to feed or convey the first liner 120 from a supply of roll stock to a location underneath a manual or automatic spray gun or nozzle (broadly, an applicator or sprayer). The coating 112 may then be sprayed onto the inner surface 116 of the first liner 120. In exemplary embodiments, the entire inner surface 116 of the first liner 120 is coated with the coating 112. Alternatively, the coating 112 may be applied in a predetermined pattern along the inner surface 116 of the first liner 120, such as a striped pattern, a dotted pattern, etc. By way of example, the coating 112 along the inner surface 116 of the first liner 120 may have a thickness less than about 76 micrometers or microns. Or, for example, the coating 112 along the inner surface 116 of the first liner 120 may be within a range from about 8 micrometers to about 76 micrometers. In one exemplary embodiment, the coating 112 along the inner surface 116 of the first liner 120 has a thickness of about 25 micrometers. In alternative embodiments, the coating thickness may be different (e.g., greater than 76 micrometers, less than 8 micrometers, higher or lower than 25 micrometers, etc.) and/or the coating may be applied by other means or methods besides spraying (e.g., dip coating, etc.), and/or other means for feeding the first liner 120 may be used besides rollers 128.

The coating 112 may also be wet coated onto (broadly, applied to) an inner or lower surface 132 of a second or upper liner 136 (e.g., a polyethylene terephthalate (PET) carrier and/or release liner, an embossed polyethylene liner, etc.) along which the TIM 124 will be disposed. The coating 112 is disposed between the inner surface 132 of the second liner 136 and the upper surface of the TIM 124. By way of example, rollers 128 may feed the second liner 136 from a supply of roll stock to a location underneath a manual or automatic spray gun or nozzle. The coating 112 may then be sprayed onto the inner surface 132 of the second liner 136. In exemplary embodiments, the entire inner surface 132 of the second liner 136 is coated with the coating 112. Alternatively, the coating 112 may be applied in a predetermined pattern along the inner surface 132 of the second liner 136, such as a striped pattern, a dotted pattern, etc. By way of example, the coating 112 along the inner surface 132 of the second liner 136 may have a thickness less than about 76 micrometers or microns. Or, for example, the coating 112 along the inner surface 132 of the second liner 136 may be within a range from about 8 micrometers to about 76 micrometers. In one exemplary embodiment, the coating 112 along the inner surface 132 of the second liner 136 has a thickness of about 25 micrometers. In alternative embodiments, the coating thickness may be different (e.g., greater than 76 micrometers, less than 8 micrometers, higher or lower than 25 micrometers, etc.) and/or the coating may be applied by other means or methods besides spraying (e.g., dip coating, etc.), and/or other means for feeding the second liner 136 may be used besides rollers 128.

Figure 2:
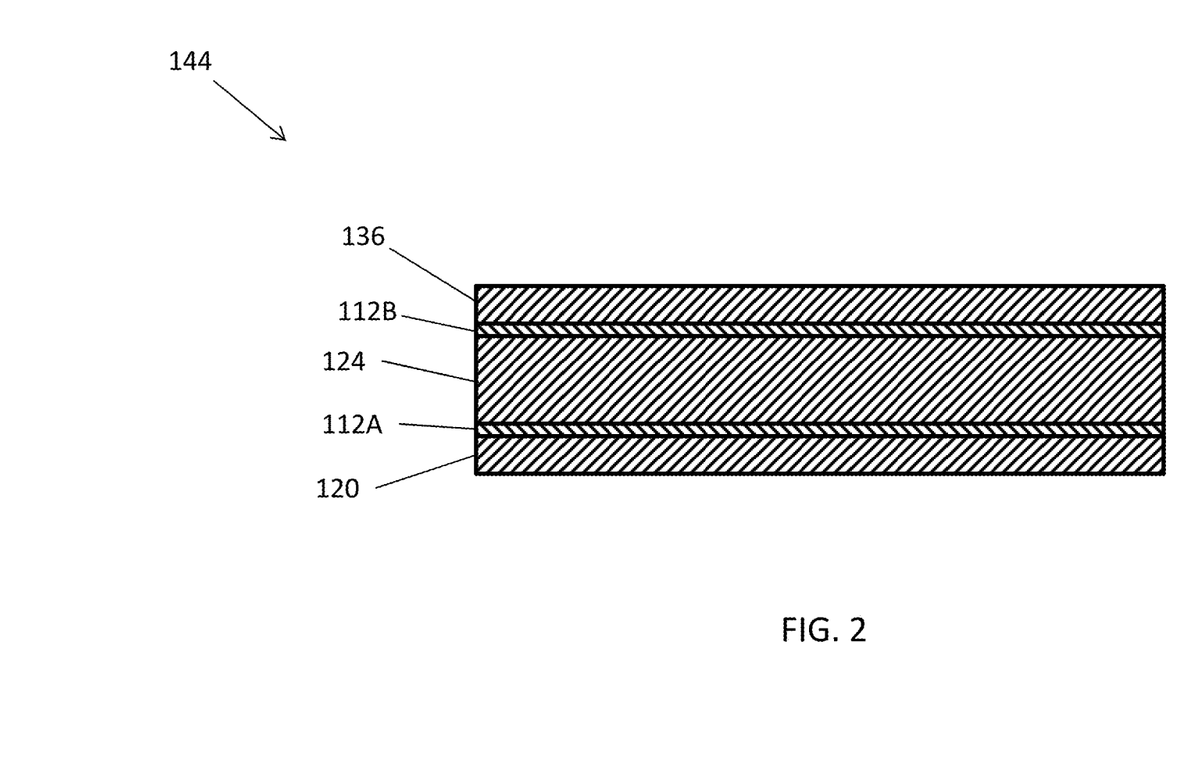
FIG. 2 is a cross-sectional view of an exemplary embodiment of a thermal interface material assembly that may be made using the system shown in FIG. 1, where the thermal interface material assembly includes a thermal interface material disposed between first and second coatings (e.g., silicone or silicone compound mixture, etc.), which are along the inner surfaces of respective first and second liners.

During the forming and curing process 108, the TIM 124 is disposed or applied atop the coating 112 along the inner surface 116 of the first liner 120. For example, the TIM 124 may comprise an uncured product mixture compound (e.g., uncured thermally-conductive gap filler sheet material, etc.) that is pumped, dispensed, or otherwise applied onto the first liner 120 over top the coating 112. The second liner 136 may then be applied over the TIM 124 to thereby cover and protect the upper surface of the TIM 124. Accordingly, the first and second liners 120, 136 are respectively positioned along opposite lower and upper sides or surfaces of the TIM 124 as shown in FIG. 2. The TIM 124 is disposed or sandwiched between the first or lower coating 112A along the inner surface 116 of the first liner 120 and the second or upper coating 112B along the inner surface 132 of the second liner 136. The TIM 124, first and second liners 120, 136, and coatings 112A, 112B may be collectively referred to herein as a thermal interface material assembly 144.

The thermal interface material assembly 144 may then be compressed, such as by using rollers 140 (FIG. 1), etc. By way of example, the compression of the thermal interface material assembly 144 may reduce the thickness of the TIM 124, e.g., from an initial thickness of about 4 millimeters (mm) down to a sheet thickness of about 2.5 mm, etc. In alternative embodiments, other means for compressing the TIM 124 may be used besides rollers 140.

The TIM 124 may then undergo a curing process. During the curing process, the thermal interface material assembly 144 may be heated while the TIM 124 is positioned between the first and second liners 120, 136. By way of example, the TIM 124 may be heated with a heater to a curing temperature within a range of about 100 degrees Celsius (° C.) to about 150° C. to thereby cure the TIM 124.

Before applying or using the TIM 124 in an end use or application (e.g., within an electronic device, etc.), the first and second liners 120, 136 may be removed from (e.g., peeled off, etc.) the TIM 124. After the liners 120, 136 are removed, the coatings 112A, 112B previously applied to the respective liners 120, 136 are transferred to and/or remain along the respective lower and upper surfaces of the TIM 124, whereby the coatings 112A, 112B change the surface tack of the respective lower and upper surfaces of the TIM 124.

By way of example, the liners 120, 136 may include corner tabs for easier removal of the liners and easier handleablity (e.g., without the requirement of tools such as a spatula, etc.). In some exemplary embodiments, the wet coating may be configured (e.g., wet coating chemical(s) may be selected, etc.) to participate in the thermal compound cross linking reaction. For example, the coating 112 may include polysiloxane, and there may be silicon hydrogen functional groups and vinyl functional groups in the chemical structure.

In exemplary embodiments, the first coating 112A along the inner surface 116 of the first liner 120 has the same formulation (e.g., same silicone or silicone compound mixture, etc.) and coating thickness as the second coating 112B along the inner surface 132 of the second liner 136. In alternative embodiments, the first coating 112A may have a different formulation and/or a different thickness than the second coating 112B. In yet other embodiments, the thermal interface material assembly 144 (FIG. 2) may include the coating 112 along either the first liner 120 or the second liner 120, 136 but not both.

In exemplary embodiments, the coating 112 has different formulations including different silicon resins for controllably changing or adjusting surface tack to different levels (non-tacky, low or weak surface tack, middle surface tack, and high surface tack) depending on which formulation and which silicone resin was used. As recognized by the inventors hereof, different surface tack performance is achievable by using different silane mixtures, adjusting chemical mixture molecular weight distribution, and adjusting vinyl and silicon-hydrogen ratio to obtain design surface performance.

In an exemplary embodiment, the coating 112 included a silicone resin comprising low viscosity, low molecular weight two-part liquid silane. The resulting surface tack of the thermal interface material with the coating may be non-tacky, low or weak surface tack, or middle surface tack when using this coating formulation including low viscosity, low molecular weight two-part liquid silane.

In another exemplary embodiment, the coating 112 included a silicone resin comprising low viscosity, low molecular weight one-part liquid silane. The resulting surface tack of the thermal interface material with the coating may be non-tacky, low or weak surface tack, or middle surface tack when using this coating formulation including low viscosity, low molecular weight one-part liquid silane.

In a further exemplary embodiment, the coating 112 included a silicone resin comprising middle viscosity, middle molecular weight two-part liquid silane. The resulting surface tack of the thermal interface material with the coating may be non-tacky, low or weak surface tack, middle surface tack, or high surface tack when using this coating formulation including middle viscosity, middle molecular weight two-part liquid silane.

In an additional exemplary embodiment, the coating 112 included a silicone resin comprising middle viscosity, middle molecular weight one-part liquid silane. The resulting surface tack of the thermal interface material with the coating may be non-tacky, low or weak surface tack, middle surface tack, or high surface tack when using this coating formulation including middle viscosity, middle molecular weight one-part liquid silane.

In yet another exemplary embodiment, the coating 112 included a silicone resin comprising high viscosity, high molecular weight two-part liquid silane. The resulting surface tack of the thermal interface material with the coating may typically be high surface tack when using this coating formulation including high viscosity, high molecular weight two-part liquid silane. But other surface tack levels (e.g., non-tacky, low or weak surface tack, middle surface tack, etc.) may also be achieved after function group amount adjustment.

In still yet another exemplary embodiment, the coating 112 included a silicone resin comprising high viscosity, high molecular weight one-part liquid silane. The resulting surface tack of the thermal interface material with the coating may be non-tacky, low or weak surface tack, middle surface tack, or high surface tack when using this coating formulation including high viscosity, high molecular weight one-part liquid silane.

In other exemplary embodiments, two or more of the different above coating formulations may be used to achieve different surface tack level. For example, the coating may include a low viscosity, low molecular weight and middle viscosity, middle molecular weight silane mixture to achieve a low surface tack. Alternative embodiments may include other combinations of two or more of the different above coating formulations, e.g., low viscosity, low molecular weight two-part liquid silane, and/or low viscosity, low molecular weight one-part liquid silane, and/or middle viscosity, middle molecular weight two-part liquid silane, and/or middle viscosity, middle molecular weight one-part liquid silane, and/or high viscosity, high molecular weight two-part liquid silane, and/or high viscosity, high molecular weight one-part liquid silane, etc.

In the above exemplary embodiments, low viscosity may be defined as 100 centipoises (cp) to 400 cp, middle viscosity may be defined as 400 cp to 2000 cp, and high viscosity may be defined as greater than 2000 cp. Also in the above exemplary embodiments, low molecular weight may be defined as number average molecular weight (Mn) less than 10000, middle molecular weight may be defined as Mn from 10000 to 30000, and high molecular weight may be defined as Mn greater than 30000. Further, the above exemplary embodiments included methyl vinyl silane and a platinum catalyzer. Alternative embodiments may include other silane types or other silane reactions. In addition, the coating may also include one or more additives in exemplary embodiments, such as coupling agent, silicon-hydrogen cross-linker, etc.

Also disclosed are exemplary embodiments of methods of controllably changing (e.g., weaken, strengthen, eliminate, add, customize, alter, etc.) surface tack of thermal interface materials. In an exemplary embodiment, the method generally includes wet coating a silane mixture as disclosed herein onto a first liner before a thermal sheet material forming and curing process. The method may also include dispensing, pumping, or otherwise applying a TIM product mixture compound onto the wet coating along the first liner. A second liner with or without the wet coating of the silane mixture may be placed over the TIM product mixture such that it is thereby covered by the second liner. The TIM product mixture may then be compressed to a predetermined sheet thickness, such as a sheet thickness of about 2.5 mm, etc. The TIM sheet material may then be cured with a heater, e.g., at a curing temperature within a range from about 100° C. to about 150° C., etc. The first and second liners may then be removed from (e.g., peeled off, etc.) the cured TIM sheet before application or end use of the cured TIM sheet. In exemplary embodiments, the wet coating may be configured (e.g., chemical(s) may be selected, etc.) to participate in the thermal compound cross linking reaction.

In an exemplary embodiment for a thermal gap filler product, a PET carrier liner is used on both sides of the TIM material to protect the TIM material during the forming and curing process and also after the forming and curing process before the TIM is used. In this example, the inner surfaces of both PET carrier liners may be wet coated with a coating comprising silane as disclosed herein before the forming and curing process for the thermal gap filler product.

Figure 3:
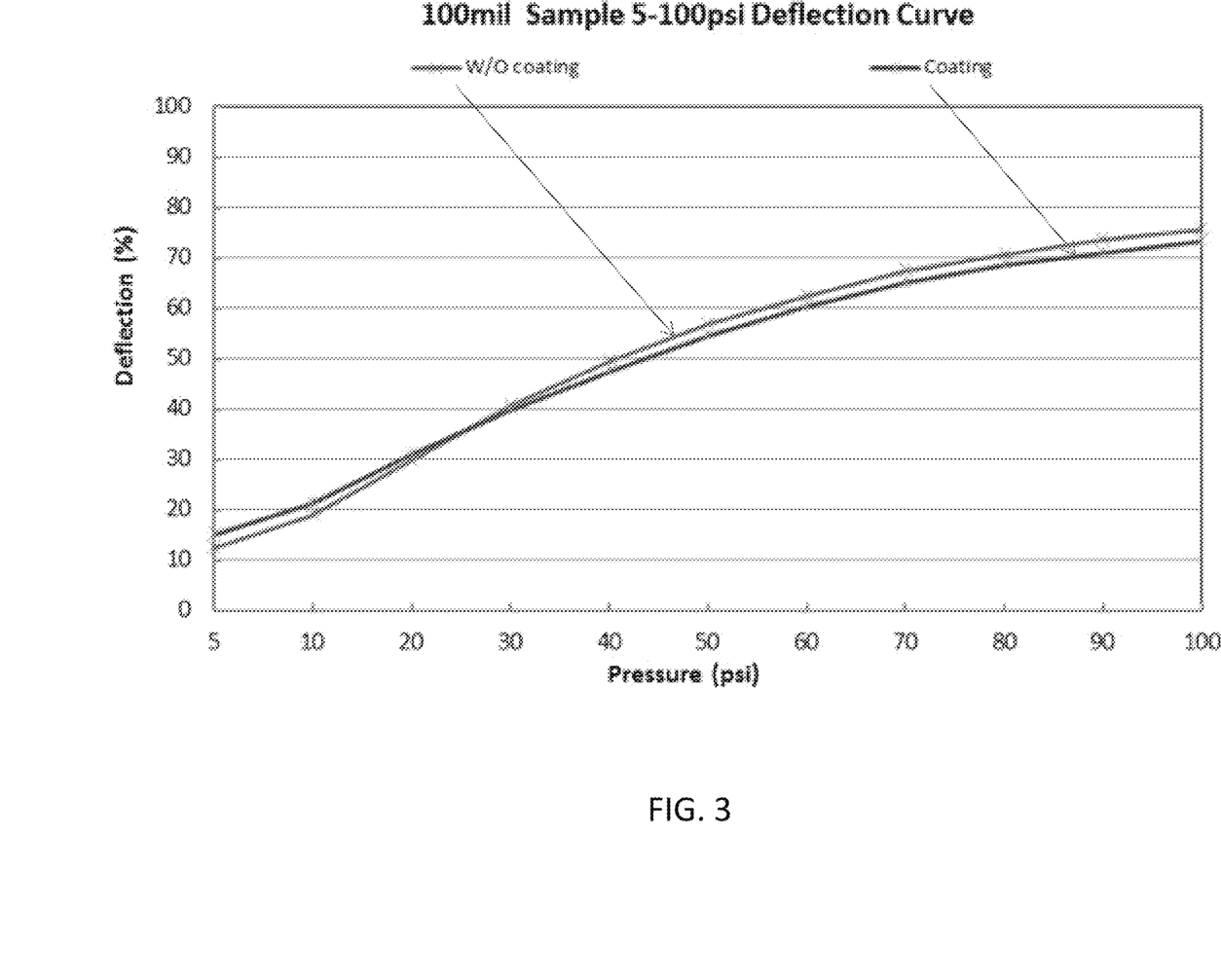
FIG. 3 is an exemplary line graph showing percent deflection versus pressure from 5 pounds per square inch (psi) to 100 psi for a 100 mil sample of a thermal interface material with a coating according to exemplary embodiments and for comparison purposes a 100 mil sample of the thermal interface material without the coating.

FIG. 3 is an exemplary line graph showing percent deflection versus pressure from 5 pounds per square inch (psi) to 100 psi for a 100 mil sample of a thermal interface material with a coating according to exemplary embodiments and for a 100 mil thick sample of the thermal interface material without the coating. For the thermal interface material with the coating, the testing was performed after the upper and lower polyethylene terephthalate (PET) release liners were removed from the thermal interface material such that the entire coating previously applied to the PET release liners was transferred to the upper and lower surfaces of the thermal interface material. The PET release liners were used to protect the thermal interface material from contamination and at the same time provide handling performance. The PET release liners were peeled off before the performance deflection testing. For both samples, the thermal interface material was a ceramic filled silicone gap filler having a thickness of 100 mils, a thermal conductivity of 5 W/mK, a hardness (3 seconds) of 55 shore 00 (1-5 mm) or 66 Shore 00 (0.5-0.75 mm), and a specific gravity of 3.3. The coating was a mid-tacky coating with two kinds of middle viscosity silane (e.g., silane with viscosity of about 450 centipoises (cp) and another silane with viscosity of about 650 cp, a silane with viscosity of about 400 cp to 600 cp and another silane with viscosity of about 1500 cp to about 2000 cp, etc.). As shown, the sample with the coating and the sample without the coating had similar deflection characteristics. Accordingly, the coating did not significantly degrade or affect the deflection characteristics of the thermal interface material. This line graph and results therein are provided for purpose of illustration only as other embodiments may be configured differently (e.g., different thermal interface material, another coating(s) disclosed herein, etc.) and have different deflection characteristics.

In exemplary embodiments, thermal gap filler material surface tack may be defined or described by a 180° C. release liner peeling force test and a 90° C. peel gap filler material from stainless steel plate test. For example, non-tacky may be defined as a peeling force less than 10 grams, low surface tack may be defined as a peeling force between 10 grams and 20 grams, middle surface tack may be defined as a peeling force between 20 grams to 50 grams, and high surface tack may be defined as a peeling force between greater than 50 grams.

As shown by the tables below, surface tack may range from lower than 5 grams up to as high as 100 grams as determined by the 90° C. peel gap filler material from stainless steel plate test. For example, the results in table 1 show how surface tack of a thermal interface material may be decreased by applying a non-tacky coating that includes low viscosity, low molecular weight one-part liquid silane. In this example, the thermal interface material was a compliant thermal gap filler material made of a filled silicone elastomer on a silicone dielectric carrier liner. The thermal interface material has a thermal conductivity of 1.2 W/mK, a hardness (shore 00) of 13, an operating temperature range from −40° C. to 200° C., a breakdown voltage greater than 10000 VAC (volts alternating current), a light yellow color, and a UL 94 V-0 flammability rating.

The results in table 2 show how surface tack of a thermal interface material may be increased by applying one of four different coatings. In this example, the thermal interface material was a compliant thermal gap filler material made of ceramic filled silicone elastomer, which had a thermal conductivity of 1.1 W/mK, a hardness (shore 00) of 45, an operating temperature range from −45° C. to 160° C., a breakdown voltage greater than 27 kVAC, a light gray color, a UL 94 V-0 flammability rating, and a tensile strength of 48 psi. The mid-tacky coating 1 includes two kinds of middle viscosity, middle molecular weight two-part liquid silane (e.g., a middle molecular weight two-part liquid silane with viscosity of about 450 cp and a middle molecular weight two-part liquid silane with viscosity of about 650 cp, etc.). The mid-tacky coating 2 includes a middle viscosity, middle molecular weight two-part liquid silane and a high viscosity, high molecular weight two-part liquid silane. The mid-tacky coating 3 includes two kinds of middle viscosity, middle molecular weight two-part liquid silane (e.g., a middle molecular weight two-part liquid silane with viscosity of about 400 cp to about 600 cp and a middle molecular weight two-part liquid silane with viscosity of about 1500 cp to about 2000 cp, etc.). The high-tacky coating includes two kinds of high viscosity, high molecular weight two-part liquid silane(e.g., a high molecular weight two-part liquid silane with viscosity of about 4000 cp to about 5000 cp and a high molecular weight two-part liquid silane with viscosity of about 8000 cp to about 10000 cp, etc.).

As shown by the example in table 3, the coatings have only a very limited effect on thermal performance of the underlying TIM. For example, table 3 shows that the thermal resistance at 60 mil and 50° C. only increased slightly from 0.51° C. in$^2$/W (with no coating) to 0.522° C. in$^2$/W (with coating) for a thermal interface material comprising silicone resin, thermally-conductive fillers, color paste, and additive agents, and a coating comprising two kinds of middle viscosity, middle molecular weight two-part liquid silane.

TABLE 1

Decrease Surface Tackiness Coating

| Peeling Force | 180° C. PET Liner Peeling Force | 90° C. Steel Panel Peeling Force | Comments |
|---|---|---|---|
| TIM without Coating | 45.7 grams | 51.4 grams | High tacky, original |
| TIM with Non-Tacky Coating | 0.5 grams | 4.8 grams | Non-tacky |

TABLE 2

Increase Surface Tackiness Coating

| Peeling Force | 180° C. PET Liner Peeling Force | 90° C. Steel Panel Peeling Force | Comments |
|---|---|---|---|
| TIM without Coating | 15.4 grams | 16.1 grams | Weak surface tack, original |
| TIM with Mid-Tacky Coating 1 | 35.4 grams | 39.2 grams | Mid surface tacky |
| TIM with Mid-Tacky Coating 2 | 46.1 grams | 50 grams | Mid surface tacky |
| TIM with Mid-Tacky Coating 3 | 38.1 grams | 48 grams | Mid surface tacky |
| TIM with High-Tacky Coating | 62 grams | 94.5 grams | High surface tacky |

TABLE 3

Thermal Performance

| Pad Hardness | Thermal Conductivity | Thermal Resistance at 60 mil and 50° C. (° C. in$^2$/W) | | 180° C. PET Liner Peeling Force (grams) | | 90° C. Steel Panel Peeling Force (grams) | |
|---|---|---|---|---|---|---|---|
| | | without coating | with coating | without coating | with coating | without coating | with coating |
| (Shore 00, 3 second delay) | (W/mk) (Hot Disk) | | | | | | |
| 34 | 4.096 | 0.51 | 0.522 | 29.4 | 17 | 38.1 | 14.5 |

The above tables and results therein are provided for purpose of illustration only. Other embodiments may include other coating formulations and/or other thermal interface materials such that the surface tack and/or other material properties are different than what is shown in the tables.

Exemplary embodiments are disclosed of thermal interface material assemblies that include a thermal interface material, a first liner, and a first coating between a first surface of the thermal interface material and an inner surface of the first liner. The first coating comprises a one-part silane and/or a two-part silane. The first coating is configured such that at least a portion of the first coating will remain along the first surface of the thermal interface material after removal of the first liner from the thermal interface material assembly to thereby change a surface tack of the first surface of the thermal interface material.

The first coating may comprise a two-part silane having a viscosity less than 400 centipoises and a number average molecular weight less than 10000; and/or a one-part silane having a viscosity less than 400 centipoises and a number average molecular weight less than 10000; and/or a two-part silane having a viscosity from 400 centipoises to 2000 centipoises and a number average molecular weight from 10000 to 30000; and/or a one-part silane having a viscosity from 400 centipoises to 2000 centipoises and a number average molecular weight from 10000 to 30000; and/or a two-part silane having a viscosity greater than 2000 centipoises and a number average molecular weight greater than 30000; and/or a one-part silane having a viscosity greater than 2000 centipoises and a number average molecular weight greater than 30000.

The first coating may comprise methyl vinyl silane and a platinum catalyzer. The first coating may comprise a coupling agent and/or a silicon-hydrogen cross-linker. The first liner may comprise a polyethylene terephthalate liner. The first coating may comprise a wet coating having a thickness within a range from about 8 micrometers to about 76 micrometers. The thermal interface material may comprise a thermally-conductive gap filler sheet material having the first surface with a surface tack that is increased or decreased by the first coating.

The thermal interface material assembly may further comprise a second liner and a second coating between a second surface of the thermal interface material and an inner surface of the second liner. The second coating may comprise a one-part silane and/or a two-part silane. The second coating may be configured such that at least a portion of the second coating will remain along the second surface of the thermal interface material after removal of the second liner from the thermal interface material assembly to thereby change a surface tack of the second surface of the thermal interface material.

The second coating may have a formulation that is the same as a formulation of the first coating. The second coating may comprise a two-part silane having a viscosity less than 400 centipoises and a number average molecular weight less than 10000; and/or a one-part silane having a viscosity less than 400 centipoises and a number average molecular weight less than 10000; and/or a two-part silane having a viscosity from 400 centipoises to 2000 centipoises and a number average molecular weight from 10000 to 30000; and/or a one-part silane having a viscosity from 400 centipoises to 2000 centipoises and a number average molecular weight from 10000 to 30000; and/or a two-part silane having a viscosity greater than 2000 centipoises and a number average molecular weight greater than 30000; and/or a one-part silane having a viscosity greater than 2000 centipoises and a number average molecular weight greater than 30000.

The second coating may comprise methyl vinyl silane and a platinum catalyzer. The second liner may comprise a polyethylene terephthalate liner. The second coating may comprise a wet coating having a thickness within a range from about 8 micrometers to about 76 micrometers. The thermal interface material may comprise a thermally-conductive gap filler sheet material having the second surface with a surface tack that is increased or decreased by the second coating.

Also disclosed are exemplary embodiments of thermal interface material assemblies that comprise a thermal interface material and a first coating along a first surface of the thermal interface material. The first coating may include a one-part silane and/or a two-part silane. The first coating may increase or decrease the surface tack of the first surface of the thermal interface material.

The first coating may comprise a two-part silane having a viscosity less than 400 centipoises and a number average molecular weight less than 10000; and/or a one-part silane having a viscosity less than 400 centipoises and a number average molecular weight less than 10000; and/or a two-part silane having a viscosity from 400 centipoises to 2000 centipoises and a number average molecular weight from 10000 to 30000; and/or a one-part silane having a viscosity from 400 centipoises to 2000 centipoises and a number average molecular weight from 10000 to 30000; and/or a two-part silane having a viscosity greater than 2000 centipoises and a number average molecular weight greater than 30000; and/or a one-part silane having a viscosity greater than 2000 centipoises and a number average molecular weight greater than 30000.

The first coating may comprise methyl vinyl silane and a platinum catalyzer. The first coating may comprise a coupling agent and/or a silicon-hydrogen cross-linker. The thermal interface material may comprise a thermally-conductive gap filler sheet material having the first surface with a surface tack that is increased or decreased by the first coating.

The thermal interface material assembly may further comprise a second coating along a second surface of the thermal interface material. The second coating may include a one-part silane and/or a two-part silane. The second coating may increase or decrease a surface tack of the second surface of the thermal interface material.

The second coating may have a formulation that is the same as a formulation of the first coating. The second coating may comprise a two-part silane having a viscosity less than 400 centipoises and a number average molecular weight less than 10000; and/or a one-part silane having a viscosity less than 400 centipoises and a number average molecular weight less than 10000; and/or a two-part silane having a viscosity from 400 centipoises to 2000 centipoises and a number average molecular weight from 10000 to 30000; and/or a one-part silane having a viscosity from 400 centipoises to 2000 centipoises and a number average molecular weight from 10000 to 30000; and/or a two-part silane having a viscosity greater than 2000 centipoises and a number average molecular weight greater than 30000; and/or a one-part silane having a viscosity greater than 2000 centipoises and a number average molecular weight greater than 30000.

Exemplary embodiments are disclosed of systems for controllably changing surface tack of a thermal interface material. In an exemplary embodiment, a system comprises means for applying a first coating along an inner surface of a first liner; and means for applying a thermal interface material along the first liner such that the first coating is between a first surface of the thermal interface material and the inner surface of the first liner. The first coating may comprise a one-part silane and/or a two-part silane. The first coating may be configured such that at least a portion of the first coating will remain along the first surface of the thermal interface material after removal of the first liner from the thermal interface material to thereby change a surface tack of the first surface of the thermal interface material.

The system may further comprise means for forming the thermal interface material and means for curing the thermal interface material after the first coating has been applied along the inner surface of the first liner and after the thermal interface material has been applied along the first liner. The means for forming may comprise one or more rollers for compressing the thermal interface material to thereby reduce a thickness of the thermal interface material. The means for curing may include a heater for heating the thermal interface material to a curing temperature. The first coating may comprise a two-part silane having a viscosity less than 400 centipoises and a number average molecular weight less than 10000; and/or a one-part silane having a viscosity less than 400 centipoises and a number average molecular weight less than 10000; and/or a two-part silane having a viscosity from 400 centipoises to 2000 centipoises and a number average molecular weight from 10000 to 30000; and/or a one-part silane having a viscosity from 400 centipoises to 2000 centipoises and a number average molecular weight from 10000 to 30000; and/or two-part silane having a viscosity greater than 2000 centipoises and a number average molecular weight greater than 30000; and/or a one-part silane having a viscosity greater than 2000 centipoises and a number average molecular weight greater than 30000. The first coating may comprise methyl vinyl silane and a platinum catalyzer. The first coating may comprise a coupling agent and/or a silicon-hydrogen cross-linker.

The system may further comprise means for applying a second coating along an inner surface of a second liner, and means for applying the second liner over a second surface of the thermal interface material such that the second coating is between the second surface of the thermal interface material and the inner surface of the second liner. The second coating may comprise a one-part silane and/or a two-part silane. The second coating may be configured such that at least a portion of the second coating will remain along the second surface of the thermal interface material after removal of the second liner from the thermal interface material to thereby change a surface tack of the second surface of the thermal interface material. The second coating may have a formulation that is the same as a formulation of the first coating. The second coating may comprise a two-part silane having a viscosity less than 400 centipoises and a number average molecular weight less than 10000; and/or a one-part silane having a viscosity less than 400 centipoises and a number average molecular weight less than 10000; and/or a two-part silane having a viscosity from 400 centipoises to 2000 centipoises and a number average molecular weight from 10000 to 30000; and/or a one-part silane having a viscosity from 400 centipoises to 2000 centipoises and a number average molecular weight from 10000 to 30000; and/or a two-part silane having a viscosity greater than 2000 centipoises and a number average molecular weight greater than 30000; and/or a one-part silane having a viscosity greater than 2000 centipoises and a number average molecular weight greater than 30000.

Also disclosed are methods of controllably changing surface tack of a thermal interface material. In an exemplary embodiment, a method includes applying a first coating along an inner surface of a first liner, and applying a thermal interface material along the first liner such that the first coating is between a first surface of the thermal interface material and the inner surface of the first liner. The first coating may comprise a one-part silane and/or a two-part silane. The first coating may be configured such that at least a portion of the first coating will remain along the first surface of the thermal interface material after removal of the first liner from the thermal interface material to thereby change a surface tack of the first surface of the thermal interface material.

The method may further comprise forming and curing the thermal interface material after applying the first coating and after applying the thermal interface material to the first liner. Applying the first coating may comprise wet coating the first coating along the inner surface of first liner. Forming the thermal interface material may comprise compressing the thermal interface material to thereby reduce a thickness of the thermal interface material. Curing the thermal interface material may comprise heating the thermal interface material to a curing temperature.

The first coating may comprise a two-part silane having a viscosity less than 400 centipoises and a number average molecular weight less than 10000; and/or a one-part silane having a viscosity less than 400 centipoises and a number average molecular weight less than 10000; and/or a two-part silane having a viscosity from 400 centipoises to 2000 centipoises and a number average molecular weight from 10000 to 30000; and/or a one-part silane having a viscosity from 400 centipoises to 2000 centipoises and a number average molecular weight from 10000 to 30000; and/or a two-part silane having a viscosity greater than 2000 centipoises and a number average molecular weight greater than 30000; and/or a one-part silane having a viscosity greater than 2000 centipoises and a number average molecular weight greater than 30000. The first coating may comprise methyl vinyl silane and a platinum catalyzer. The first coating may comprise a coupling agent and/or a silicon-hydrogen cross-linker.

The method may further comprise applying a second coating along an inner surface of a second liner, applying the second liner over a second surface of the thermal interface material such that the second coating is between the second surface of the thermal interface material and the inner surface of the second liner, and forming and curing the thermal interface material while the thermal interface material is between the first and second liners. The second coating may comprise a one-part silane and/or a two-part silane.

The method further may comprise removing the first and second liners from the respective first and second surfaces of the thermal interface materials. The first and second coatings (or portions thereof) may remain along the respective first and second surfaces of the thermal interface material after removal of the first and second liners to thereby change the surface tack of the respective first and second surfaces of the thermal interface material. The second coating may have a formulation that is the same as a formulation of the first coating. The second coating may comprise a two-part silane having a viscosity less than 400 centipoises and a number average molecular weight less than 10000; and/or a one-part silane having a viscosity less than 400 centipoises and a number average molecular weight less than 10000; and/or a two-part silane having a viscosity from 400 centipoises to 2000 centipoises and a number average molecular weight from 10000 to 30000; and/or a one-part silane having a viscosity from 400 centipoises to 2000 centipoises and a number average molecular weight from 10000 to 30000; and/or a two-part silane having a viscosity greater than 2000 centipoises and a number average molecular weight greater than 30000; and/or a one-part silane having a viscosity greater than 2000 centipoises and a number average molecular weight greater than 30000.

A wide range of thermal interface materials may be used in exemplary embodiments for the thermal interface material (TIM) 124 shown in FIGS. 1 and 2. For example, the TIM 124 may comprise a metal free thermal gap filler having a thermal conductivity of about 5 W/mK. The thermal gap filler may be lead free and include silicone elastomer and a fiberglass backing or carrier. As another example, the TIM 124 may comprise a compliant thermal gap filler material having a thermal conductivity of 1.2 W/mK and made of a filled (e.g., ceramic and/or boron nitride filled, etc.) silicone elastomer that is on a silicone dielectric carrier liner. As yet another example, the TIM 124 may comprise a compliant thermal gap filler material having a thermal conductivity of 1.1 W/mK and made of ceramic filled silicone elastomer.

Example thermal interface materials that may be used in exemplary embodiments include thermal gap fillers, thermally-conductive EMI absorbers or hybrid thermal/EMI absorbers, thermal pads, etc. Example embodiments may include one or more thermal interface materials of Laird, such as any one or more of the Tflex™ series gap fillers (e.g., Tflex™ 300 series thermal gap filler materials, Tflex™ 600 series thermal gap filler materials, Tflex™ 700 series thermal gap filler materials, etc.), Tpli™ series gap fillers (e.g., Tpli™ 200 series gap fillers, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), etc. In some exemplary embodiments, the thermal interface material may comprise a compliant thermal gap filler having high thermal conductivity.

By way of example, the thermal interface material may comprise a thermal interface material of Laird, such as one or more of Tflex™ 200, Tflex™ HR200, Tflex™ 300, Tflex™ 300TG, Tflex™ HR400, Tflex™ 500, Tflex™ 600, Tflex™ HR600, Tflex™ SF600, Tflex™ 700, Tflex™ SF800, Tflex™ HD700, Tflex™ HW100 (with TG), Tflex™ 2100V0, Tflex™ 530FG thermal gap fillers.

In some exemplary embodiments, the thermal interface material comprises a ceramic filled silicone gap filler having a thermal conductivity of 5 W/mK, a hardness 3 seconds) of 55 shore 00 (1-5 mm) or 66 Shore 00 (0.5-0.75 mm), and a specific gravity of 3.3. In other exemplary embodiments, the thermal interface material comprises a ceramic filled silicone elastomer gap filler that is free standing, having a thermal conductivity of 1.1 W/mK, a hardness (shore 00) of 45, an operating temperature range from −45° C. to 160° C., a breakdown voltage greater than 27 kVAC, a light gray color, a UL 94 V-0 flammability rating, and a tensile strength of 48 psi. In additional exemplary embodiments, the thermal interface material comprises a compliant thermal gap filler material made of a filled silicone elastomer on a silicone dielectric carrier liner, where the thermal interface material has a thermal conductivity of 1.2 W/mK, a hardness (shore 00) of 13, a specific gravity of 2.3, a breakdown voltage greater than 10000 VAC (volts alternating current), a light yellow color, and a UL 94 V-0 flammability rating. In further exemplary embodiments, the thermal interface materials comprises a filled silicone elastomer gap filler having a thermal conductivity of 2.8 W/mK, a hardness (3 seconds) of 40 shore 00, a density of 3 grams per cubic centimeter (g/cc), a UL 94 V-0 flammability rating, an operating temperature range from −50° C. to 200° C., and a light blue color.

The thermal interface material may comprise an elastomer and/or ceramic particles, metal particles, ferrite EMI/RFI absorbing particles, metal or fiberglass meshes in a base of rubber, gel, or wax, etc. The thermal interface material may comprise a compliant or conformable silicone pad, non-silicone based material (e.g., non-silicone based gap filler materials, thermoplastic and/or thermoset polymeric, elastomeric materials, etc.), thermally-conductive additive, etc. The thermal interface material may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the thermal interface material to closely conform (e.g., in a relatively close fitting and encapsulating manner, etc.) to a mating surface when placed in contact with (e.g., compressed against, etc.) the mating surface, including a non-flat, curved, or uneven mating surface.

The thermal interface material may include a soft thermal interface material formed from elastomer and at least one thermally-conductive metal, boron nitride, and/or ceramic filler, such that the soft thermal interface material is conformable even without undergoing a phase change or reflow. In some exemplary embodiments, the thermal interface material may include ceramic filled silicone elastomer, boron nitride filled silicone elastomer, fiberglass reinforced gap filler, or a thermal phase change material that includes a generally non-reinforced film. The thermal interface material may have a relatively low Young's modulus and Hardness Shore value (e.g., Shore 00 hardness of 25, 40, 60, 70, 75, less than 100, less than 25, greater than 75, between 25 and 75 Shore 00, etc.).

Exemplary embodiments may include a thermal interface material having a high thermal conductivity (e.g., 1 W/mK (watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, etc.) depending on the particular materials used to make the thermal interface material and loading percentage of the thermally conductive filler, if any. These thermal conductivities are only examples as other embodiments may include a thermal interface material with a thermal conductivity higher than 6 W/mK, less than 1 W/mK, or other values between 1 and 6 W/mk. Accordingly, aspects of the present disclosure should not be limited to use with any particular thermal interface material as exemplary embodiments may include a wide range of thermal interface materials.

A wide range of liners may be used in exemplary embodiments for the liners 120, 136 shown in FIGS. 1 and 2. In exemplary embodiments, the liners 120, 136 comprised polyethylene terephthalate (PET) carrier/release liners. Alternative embodiments may include other liners, such as an embossed polyethylene liner, etc.

In exemplary embodiments, a thermal interface material disclosed herein may be used to define or provide part of a thermally-conductive heat path from a heat source to a heat removal/dissipation structure or component. For example, a thermal interface material may be used, for example, to help conduct thermal energy (e.g., heat, etc.) away from a heat source of an electronic device (e.g., one or more heat generating components, central processing unit (CPU), die, semiconductor device, etc.). A thermal interface material may be positioned generally between a heat source and a heat removal/dissipation structure or component (e.g., a heat spreader, a heat sink, a heat pipe, a device exterior case or housing, etc.) to establish a thermal joint, interface, pathway, or thermally-conductive heat path along which heat may be transferred (e.g., conducted) from the heat source to the heat removal/dissipation structure or component. During operation, the thermal interface material may then function to allow transfer (e.g., to conduct heat, etc.) of heat from the heat source along the thermally-conductive path to the heat removal/dissipation structure or component.

In example embodiments, a thermal interface material disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to use with any single type of heat source, electronic device, heat removal/dissipation structure, etc.

Exemplary embodiments may provide one or more (but not necessarily any or all) of the following features or advantages, such as modifying the surface tack in order to better meet customer surface tack requirements while also strengthening thermal material competence. Exemplary embodiments may help resolve the conflict or better balance the tradeoff between the application performance and functional performance of thermal interface materials. Exemplary embodiments may help resolve the conflict that sometimes exists between the platform product and different customer different material surface tack requirements. For example, conventional thermal interface material may have material pull out or peeling off issue caused by uncontrollable and undetectable release issue of the protective liners. Very soft or compliable thermal interface materials may have a surface tack that is too high. Exemplary embodiments may allow for new platform products with a customized level of material surface tack. Exemplary embodiments may provide for special functional performance by surface coating with different function chemicals. With exemplary embodiments, the surface tack of existing thermal interface materials may be customized (e.g., increased, reduced, added, eliminated, etc.) to better meet customer application requests. Exemplary embodiments may allow for increased thermal gap filler production yield rates as compared to conventional processes and/or may help solve instability issues associated with some conventional thermal gap filler products. For example, thermal gap filler production yield rates may be increased due and product scrap rate may be decreased due to the more stable and uniform product surface tack achievable with exemplary embodiments, thereby resulting in less pull out or peeling off quality issues.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal interface material assembly comprising a thermal interface material having first and second surfaces, a first coating along the first surface of the thermal interface material, and a second coating along the second surface of the thermal interface material, wherein:
    the thermal interface material comprises thermally-conductive filler;
    the first coating decreases the surface tack of the first surface of the thermal interface material to a first level less than the surface tack of the underlying thermal interface material;
    the second coating increases the surface tack of the second surface of the thermal interface material to a second level more than the surface tack of the underlying thermal interface material; and
    the first coating is chemically bonded or is configured to be chemically bonded to the thermal interface material via cross linking of the first coating with the thermal interface material.

2. The thermal interface material assembly of claim 1, wherein the first coating is chemically bonded to the thermal interface material via a reaction including cross linking of polymer chains of the first coating and polymer chains of the thermal interface material.

3. The thermal interface material assembly of claim 1, wherein the first coating comprises a silicon-hydrogen functional group cross-linker.

4. The thermal interface material assembly of claim 1, wherein the first coating includes a one-part and/or two-part silane composition.

5. The thermal interface material assembly of claim 1, wherein the second coating comprises a two-part silane composition.

6. The thermal interface material assembly of claim 1, wherein:
    the first coating includes polysiloxane; and/or
    the first coating includes silicon hydrogen functional groups and vinyl functional groups.

7. The thermal interface material assembly of claim 1, wherein the first coating comprises methyl vinyl silane, a platinum catalyzer, a coupling agent, and a silicon-hydrogen functional group cross-linker.

8. The thermal interface material assembly of claim 1, wherein:
    the thermal interface material comprises a first silicone and the thermally-conductive filler;
    the first coating comprises a second silicone; and
    the first coating is chemically bonded to the thermal interface material via a reaction including cross linking of polymer chains of the respective thermal interface material and the first coating.

9. The thermal interface material assembly of claim 1, wherein the first coating comprises a one-part silane composition having a viscosity less than 400 centipoises.

10. The thermal interface material assembly of claim 9, wherein the first coating further comprises a two-part silane composition having a viscosity from 400 centipoises to 2000 centipoises.

11. The thermal interface material assembly of claim 10, wherein:
    the one-part silane composition has a number average molecular weight less than 10000; and the two-part silane composition has a number average molecular weight from 10000 to 30000.

12. The thermal interface material assembly of claim 9, wherein the first coating further comprises a two-part silane composition having a viscosity greater than 2000 centipoises.

13. The thermal interface material assembly of claim 12, wherein:
the one-part silane composition has a number average molecular weight less than 10000; and
the two-part silane composition has a number average molecular weight greater than 30000.

14. The thermal interface material assembly of claim 1, wherein:
the first coating is directly on the first surface of the thermal interface material; and
the second coating is directly on the second surface of the thermal interface material.

15. The thermal interface material assembly of claim 1, further comprising a first liner, and wherein the first coating is between the first surface of the thermal interface material and an inner surface of the first liner, whereby the first coating is configured such that at least a portion of the first coating will remain along the first surface of the thermal interface material after removal of the first liner from the thermal interface material assembly to thereby decrease the surface tack of the first surface of the thermal interface material.

16. The thermal interface material assembly of claim 1, wherein:
the thermal interface material comprises a first silicone and the thermally-conductive filler;
the first coating comprises a second silicone; and
the second coating comprises a third silicone.

17. The thermal interface material assembly of claim 16, further comprising a first liner and a second liner, wherein:
the first coating is between the first surface of the thermal interface material and an inner surface of the first liner, whereby the first coating is configured such that at least a portion of the first coating will remain along the first surface of the thermal interface material after removal of the first liner from the thermal interface material assembly to thereby decrease the surface tack of the first surface of the thermal interface material; and
the second coating is between the second surface of the thermal interface material and an inner surface of the second liner, whereby the second coating is configured such that at least a portion of the second coating will remain along the second surface of the thermal interface material after removal of the second liner from the thermal interface material assembly to thereby increase the surface tack of the second surface of the thermal interface material.

18. The thermal interface material assembly of claim 1, further comprising a first liner and a second liner, wherein:
the first coating is between the first surface of the thermal interface material and an inner surface of the first liner, whereby the first coating is configured such that at least a portion of the first coating will remain along the first surface of the thermal interface material after removal of the first liner from the thermal interface material assembly to thereby decrease the surface tack of the first surface of the thermal interface material; and
the second coating is between the second surface of the thermal interface material and an inner surface of the second liner, whereby the second coating is configured such that at least a portion of the second coating will remain along the second surface of the thermal interface material after removal of the second liner from the thermal interface material assembly to thereby increase the surface tack of the second surface of the thermal interface material.

19. The thermal interface material assembly of claim 18, wherein:
the first liner comprises a first polyethylene terephthalate liner;
the second liner comprises a second polyethylene terephthalate liner; and
the thermal interface material comprises a thermally-conductive gap filler sheet material-having the first surface with the surface tack decreased by the first coating and the second surface with the surface tack increased by the second coating.

20. The thermal interface material assembly of claim 1, wherein the thermal interface material comprises a thermally-conductive gap filler sheet material having the first surface with the surface tack decreased by the first coating.

* * * * *